(12) United States Patent
Eliezer et al.

(10) Patent No.: US 7,460,499 B2
(45) Date of Patent: Dec. 2, 2008

(54) MODULATION NOISE ESTIMATION MECHANISM

(75) Inventors: Oren Eliezer, Plano, TX (US); Bogdan Staszewski, Garland, TX (US); Ofer Friedman, Ganei-Tikva (IL)

(73) Assignee: Texas Instruments Incorporated, Dallas, TX (US)

( * ) Notice: Subject to any disclaimer, the term of this patent is extended or adjusted under 35 U.S.C. 154(b) by 754 days.

(21) Appl. No.: 10/758,913

(22) Filed: Jan. 16, 2004

(65) Prior Publication Data

US 2004/0146098 A1    Jul. 29, 2004

Related U.S. Application Data

(60) Provisional application No. 60/441,080, filed on Jan. 17, 2003.

(51) Int. Cl.
*H04B 3/20* (2006.01)
(52) U.S. Cl. ..................................... 370/286
(58) Field of Classification Search ................. 370/286
See application file for complete search history.

(56) References Cited

U.S. PATENT DOCUMENTS

| | | | | |
|---|---|---|---|---|
| 5,754,437 | A * | 5/1998 | Blazo | 702/75 |
| 5,883,930 | A * | 3/1999 | Fukushi | 375/376 |
| 6,181,258 | B1 * | 1/2001 | Summers et al. | 340/870.28 |
| 6,603,821 | B1 * | 8/2003 | Doi | 375/326 |
| 6,665,339 | B1 * | 12/2003 | Adams et al. | 375/238 |
| 6,714,605 | B2 * | 3/2004 | Sugar et al. | 375/340 |
| 6,963,629 | B2 * | 11/2005 | Boerstler et al. | 375/376 |
| 7,046,792 | B2 * | 5/2006 | Harrow et al. | 379/388.06 |
| 7,203,229 | B1 * | 4/2007 | Ishida et al. | 375/226 |

OTHER PUBLICATIONS

Sakuta et al, "Measurement of Phase Noise in High Performance Oscillator Using PLL-type Frequency Multiplier", Electronics and Communications in Japan, Part 2, vol. 84, No. 8, 2001, pp. 64-70.*

(Continued)

*Primary Examiner*—Ramnandan Singh
(74) *Attorney, Agent, or Firm*—Ronald O. Neerings; Wade James Brady, III; Frederick J. Telecky, Jr.

(57) ABSTRACT

An on-chip reduced complexity modulation noise estimation mechanism for performing nonlinear signal processing to analyze modulation noise to determine whether a semiconductor device under test complies with the performance criteria set by specifications or a standard corresponding thereto. When used in a two-point transmitter modulation architecture, the mechanism relies on the fact that the noise statistics at the output of the transmitter can be determined by observing the phase error output of the phase detector within the phase locked loop. In the digital embodiment of the mechanism, the phase error signal is compared to a configurable threshold value to generate an exception event. If the number of exception events exceeds a configurable max_fail value after comparisons of a configurable number of phase error samples, the test fails. A pass/fail signal is output reflecting the result of the test. The test comprises a configurable number of test samples to permit flexibility in the tradeoff between the time required to complete the test versus the statistical reliability of the test result, i.e. the probability of it correctly determining whether the tested device complies with target specifications.

37 Claims, 5 Drawing Sheets

OTHER PUBLICATIONS

Y. Sakinori, H. Mino, Y. Sekine, "Measurement of Phase Noise in High-Precision Oscillator Using PLL-Type Frequency Multiplier", Electronics and Communications in Japan, Part 2, vol. 84, No. 8, pp. 64-70, 2001.

M. Takamiya, H. Inohara, M. Mizuno, "On-Chip Jitter-Spectrum-Analyzer for High-Speed Digital Designs", International Solid State Circuits Conf. (ISSCC) 2004.

* cited by examiner

| PHASE NOISE [dBc] | F_REF MODULATION [kHz] FOR F_REF=16MHz | PROBABILITY > 115kHz[%] | CONTENT OF EXCEPTION COUNTER [HEX] | COMPLIANCE TEST RESULT |
|---|---|---|---|---|
| -40 | 28 | 98.2 | >FF (OVERFLOW) | FAIL |
| -41.3 | 25.2 | 98.8 | >FF (OVERFLOW) | FAIL |
| -42.7 | 21 | 98.9 | >FF (OVERFLOW) | FAIL |
| -44.5 | 19 | 99.4 | >FF (OVERFLOW) | FAIL |
| -45.3 | 18 | 99.7 | >FF (OVERFLOW) | FAIL |
| -47 | 15.2 | 99.8 | >FF (OVERFLOW) | FAIL |
| -48.5 | 13.6 | 99.95 | B7 | PASS |
| -50.3 | 11.1 | 99.98 | 29 | PASS |
| -54 | 9.3 | 99.99 | 12 | PASS |
| -55.5 | 7.2 | 100 | 0B | PASS |

MODULATION NOISE ESTIMATION MECHANISM

REFERENCE TO RELATED APPLICATIONS

This application is based on U.S. Provisional Application Ser. No. 60/441,080, filed Jan. 17, 2003, entitled "Type-II-All-Digital PLL in Deep-Submicron CMOS", incorporated herein by reference in its entirety.

FIELD OF THE INVENTION

The present invention relates to the field of data communications and more particularly relates to a phase modulation noise estimation mechanism suitable for on-chip use in digitally intensive radio transceivers such as those constructed according to the Bluetooth standard.

BACKGROUND OF THE INVENTION

Designing Built-in Test (BIT) or Built-In Self Test (BIST) capabilities into semiconductor devices (i.e. chips) is a well-known technique used to place the circuitry needed to perform critical performance tests directly on the chip rather than off chip. Without the built in test circuitry, external test equipment must be used to perform the various performance tests. Several limitations of using external test equipment include making connections to the on-chip circuitry through a limited number of contact points or pins, requiring expensive test equipment capable of performing RF measurements, and requiring an extended testing time typical of such measurements. On-chip digital or software based mechanisms, which serve to substitute for such external setups, offer significant reduction in testing costs without resulting in a noticeable increase in chip cost.

Manufacturers designing and building products such as communication devices, often design their products to operate in accordance with industry standards. One such standard is the Bluetooth short-range wireless standard. In order to ensure conformance with the standard and the design specifications for a device, qualification tests are performed on the products as part of the manufacturing process. Typically, the testing of communication devices requires the device to be connected to one or more pieces of external test equipment that perform a battery of tests to ensure compliance with the specifications. The test equipment used is typically bulky in size, costly and requires routine maintenance and calibration of its own.

In the case of a digital transmitter, the standard to which it is targeted typically specifies requirements for the modulation of the data and generation of the output signal. The Bluetooth 1.1 specification describes a frequency modulation scheme having a hopping sequence of 79 channels in the 2.4 GHz ISM frequency range. A problem arises in that modulation inaccuracies and phase noise on the oscillator that generate the RF carrier translates, after frequency demodulation at the receivers, to distortion and additive baseband noise, which could degrade the receiver's performance. Therefore, transmitters must be tested for compliance against the defined modulation quality criteria, which specifies the limits on the amount of distortion and noise in their circuitry.

A diagram illustrating the frequency deviation of an example modulated signal in accordance with the Bluetooth specification is shown in FIG. 1. The nominal frequency deviation in Bluetooth is +160 kHz for a '1' and −160 kHz for a '0'. This nominal frequency deviation is not observed, however, for a '1010' sequence where the peak deviation is reduced to 0.88·160 kHz=141 kHz, as shown in the example signal 50. This reduction in the peak deviation is the result of the intentional Intersymbol Interference (ISI) caused by the Gaussian filtering of the signal which is used to narrow the spectrum of the output transmit signal. The Bluetooth specification allows the instantaneous value of the peak frequency deviation to be further reduced to below 115 kHz only once for every 1000 bits (i.e. 0.1% error). This further reduction of frequency deviation may be caused as a result of modulation inaccuracies and distortion as well as additive modulation noise (i.e. RF phase noise). The instantaneous reduction of the frequency deviation below 115 kHz constitutes a failure event as indicated by the dotted circle 52. The width of a Bluetooth symbol is 1 microsecond corresponding to a symbol rate of 1 Mbps.

In addition, frequency droop is permitted to a certain extent by the Bluetooth specification. The amount of frequency droop permitted is 25 kHz for short packets (single time slot of 625 μsec) and 40 kHz for long packets (3-5 slots). It is noted that some open loop modulators operate by remaining closed loop until data is to be transmitted at which time they open the loop and modulate the oscillator with the packet's data.

In light of the requirements of the Bluetooth specification described above, the modulation test used by the qualification test equipment is defined such that the 'average (or instantaneous) center frequency is determined by averaging over eight symbols (i.e. 8 μsec) preceding the tested sample. The samples are taken at the centers of the symbols where frequency deviation is maximal. The tested sample is then required to be within at least 115 kHz frequency distance from that instantaneous center frequency. Only one per 1000 samples is permitted to fail this criterion. The result of this test is either a pass or fail indication.

The frequency deviation and frequency droop related requirements of the Bluetooth specification must be met by devices claiming to confirm to the standard. One approach to testing products and devices for conformance with the standard is to use specialized test equipment designed just for this dedicated purpose. In the case of a semiconductor device or chip, an alternative is to use a built-in self-test mechanism to reduce the costs associated with testing.

Using a built-in self-test mechanism to estimate the modulation noise would reduce the cost of production of the chip embodying the mechanism due to the reduction in the complexity of the tester as well as a reduction in the test time. Using today's manufacturing processes, the testing of chips may comprise a significant portion of the cost of manufacturing. Since the Bluetooth qualification tests require specific parameters and qualities for the modulated signal, it is desirable to be able to verify compliance with the standard by means of internal test hardware having minimal gate count and that requires minimal measurement time.

SUMMARY OF THE INVENTION

The present invention provides a mechanism for estimating the modulation noise in a transmitter to determine whether it complies with a certain allowed limit defined by a standard or by the device's specifications. The on-chip modulation noise estimation mechanism (MNEM) of the present invention is adapted to provide the same pass/fail indication that would be provided by alternative external test equipment of high cost thus reliably determining whether a component would or would not qualify under the standard or targeted modulation and/or phase noise specifications. It does not, however, perform the test in the same manner as the prior art test equipment described in the Background Section hereinabove. This is because analysis preformed directly on the high frequency modulated signal is very difficult in practice.

The present invention is suitable for use in devices that employ closed loop or so-called 2-point modulation architectures in their transmitters. Such modulation schemes use direct oscillator modulation with a phase locked loop (PLL) to maintain frequency stability. In these closed loop designs, the baseband signal to be transmitted is fed to two points in the loop: the reference input and the RF section.

Normally, modulation of the carrier is not possible in a closed loop scheme since the loop would see the modulation as an error and attempt to correct for it. Several approaches to generating FSK using a closed loop exist. One way is to modulate the reference signal. A second way is to open the loop momentarily to send a packet of data, while suffering possible frequency droop that may occur throughout the packet as a result of the loop being open. A third way is to keep the loop closed but make the loop very slow responsive so that a modulation signal that is fast enough would not affect the loop. This requires scrambling of the data so as to prevent it from having low frequency content (e.g., a long sequence of zeros or ones).

A fourth way is to implement 2-point modulation. The injection of the baseband signal in two places in the loop causes the modulation to cancel at the output of the phase detector when the loop is in lock. Although the data modulation effects would not be observable at the output of the phase detector, effects of additive phase noise would be present since they are not anticipated by the reference. Furthermore, since the instantaneous reference input accurately represents the desired level of modulation for a given instance, any distortion or inaccuracy that would result in a difference between the actual modulation present at the modulator's output and the corresponding value present at the reference input, would be reflected at the phase detector's output.

A key aspect of the invention is that the phase error (i.e. the output of the phase detector) corresponds to the undesirable portion of the modulation (i.e. the error and/or noise). Further, since the modulation errors and noise at the RF output (within a certain bandwidth) correspond to the phase error, their statistics can be estimated through measurements on the phase error signal. The mechanism of the present invention serves to determine compliance of the device with its specifications without requiring statistical estimations and calculations of high complexity. Although the variance of the noise represents both its power and its probability to exceed the value for which an exception event would occur (i.e. peak modulation of less than 115 kHz for a single symbol in the case of a Bluetooth 1.1 signal), the direct calculation of the variance is somewhat complex, since it is defined by theory as the mean of the squares of differences between the sampled values and their average. Instead, the mechanism of the present inventions estimates the level of noise by counting the exceptions (i.e. threshold crossings) within a predefined period of time (i.e. number of symbols), thereby determining the probability of threshold crossing which corresponds to the noise power through the distribution function of the noise, which is typically a Gaussian curve as shown FIG. 3. According to the number of times the phase error exceeds the threshold, a determination is made whether the device under test passes or fails.

Several advantages of the invention include the following. First, the invention, implemented as a very low gate count digital mechanism having no cost impact, eliminates the need for expensive test equipment that would otherwise be required during production to verify compliance with the modulation criteria set forth by the particular associated standard (e.g., Bluetooth radio specifications, etc). Second, the mechanism of the invention requires a relatively short test time as compared with prior art alternative solutions, which greatly reduces test costs and consequently semiconductor production costs. Third, the configurability of the mechanism permits flexibility in the test criteria to allow (a) adjustment of the tradeoff between test time and statistical significance of the results and/or (b) testing against various different criteria/standards the radio under test may be targeting.

Fourth, the testing with the mechanism of the present invention is unobtrusive as the test may be performed while the circuit operates on-line transmitting user data without causing any performance degradation. This enables the invention to be used in applications beyond production testing, such as dynamic adjustments of phase noise (e.g., through oscillator biasing adjustment) to maintain specific performance over varying conditions (e.g., temperature changes). Thus, the test may be performed periodically during normal operation and action taken in the event the transmit quality degrades beyond predetermined levels. Alternatively, assuming sufficient margin in the detection effects which approach the compliance limits, steps may automatically be taken to reduce these effects (modulation distortion and/or noise) while maintaining satisfactory performance. Fifth, the mechanism may be adapted to operate with either an unmodulated carrier or modulated carrier. The performance difference between the two gives an indication of the accuracy of the modulator's modulation gain (typically denoted $K_{VCO}$ for a voltage controlled oscillator, or $K_{DCO}$ for a digitally controlled oscillator). When a DCO is used, which may incorporate some $K_{DCO}$ estimation circuitry, the mechanism of the present invention serves to detect inaccuracies in the estimation which may be used to further improve the estimation and thereby the modulation accuracy. Sixth, the gathering of the noise statistics of an RF output is accomplished through processing of a low frequency signal (as opposed to processing the high frequency transmit output signal).

Note that many aspects of the invention described herein may be constructed as software objects that are executed in embedded devices as firmware, software objects that are executed as part of a software application on either an embedded or non-embedded computer system running a real-time operating system such as WinCE, Symbian, OSE, Embedded LINUX, etc. or non-real time operating system such as Windows, UNIX, LINUX, etc., or as soft core realized HDL circuits embodied in an Application Specific Integrated Circuit (ASIC) or Field Programmable Gate Array (FPGA), or as functionally equivalent discrete hardware components.

There is this provided in accordance with the present invention, a method of estimating modulation noise for use in a transmitter having a phase locked loop, the method comprising the steps of calculating an average of historical samples of phase error samples produced by the phase locked loop, subtracting the average from a current phase error sample to yield a normalized phase error, generating an exception event if the normalized phase error exceeds a threshold and repeating the steps of calculating, subtracting and generating over a period of time and outputting a failure indication if the number of exception events exceeds a maximum criteria and a pass indication otherwise.

There is also provided in accordance with the present invention, an apparatus for estimating modulation noise for use in a transmitter having a phase locked loop comprising means for calculating an average of historical samples of phase error samples produced by the phase locked loop, means for subtracting the average from a current phase error sample to yield a normalized phase error, means for generating an exception event if the normalized phase error exceeds a threshold and means for repeating the functions of calculating, subtracting and generating over a period of time and outputting a failure indication if the number of exception events exceeds a maximum criteria and a pass indication otherwise.

There is further provided in accordance with the present invention, an apparatus for estimating modulation noise in a transmitter comprising first means for estimating frequency deviation errors of a signal output from the transmitter utilizing measurements of a phase error signal observed within a phase locked loop in the transmitter, second means for comparing a plurality of phase error signal samples over a period of time to a threshold and generating an exception event each time a phase error signal sample exceeds the threshold and generating a failure indication if the number of exception events exceeds a criteria and generating a pass indication otherwise.

BRIEF DESCRIPTION OF THE DRAWINGS

The invention is herein described, by way of example only, with reference to the accompanying drawings, wherein.

DETAILED DESCRIPTION OF THE INVENTION

Notation Used Throughout

Figure 1:
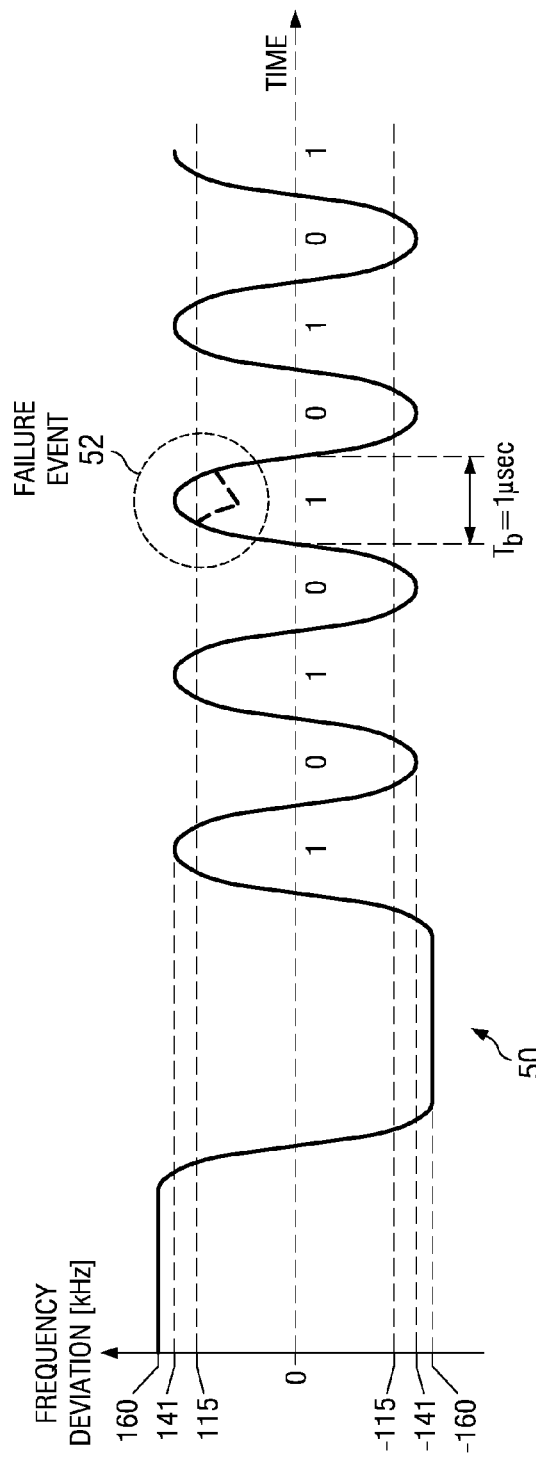
FIG. 1 is a diagram illustrating the frequency deviation of an example modulated signal representing a 111000010101010 pattern.

The following notation is used throughout this document.

| Term | Definition |
| --- | --- |
| ASIC | Application Specific Integrated Circuit |
| BIST | Built-in Self Test |
| BIT | Built-in Test |
| DC | Direct Current |
| DCO | Digitally Controlled Oscillator |
| DPLL | Digital Phase Locked Loop |
| DUT | Device Under Test |
| IF | Intermediate Frequency |
| FCW | Frequency Command Word |
| FPGA | Field Programmable Gate Array |
| HDL | Hardware Description Language |
| ISI | Intersymbol Interference |
| ISM | Industrial Scientific Medical |
| MNEC | Modulation Noise Estimation Circuit |
| MNEM | Modulation Noise Estimation Mechanism |
| nDCO | Normalized Digitally Controlled Oscillator |
| PC | Personal Computer |
| PLL | Phase Locked Loop |
| RF | Radio Frequency |

DETAILED DESCRIPTION OF THE INVENTION

The present invention is a modulation noise estimation mechanism that functions to estimate the modulation noise present in a transmitter. The modulation noise estimation mechanism of the present invention is adapted to provide a pass/fail criteria thus reliably determining whether a component would qualify under a standard such as the Bluetooth standard or would comply with defined transmitter performance specifications.

The present invention is operative for use in devices that employ closed loop or so-called 2-point modulation architectures in their transmitters. Such modulation schemes typically use direct oscillator modulation with a phase locked loop (PLL) to maintain frequency stability. In the 2-point modulation closed loop designs, the baseband signal to be transmitted is fed into two points in the loop: one point is the reference input and the second point is the RF section.

To aid in understanding the principles of the present invention, the description is provided in the context of a transceiver adapted to comply with the Bluetooth standard. It is appreciated, however, that the invention is not limited to use with Bluetooth compliant devices but can be applied to devices adapted to comply with other standards as well, such as GSM. In addition, the invention is not limited to use with the transmitter modulation scheme presented herein but is applicable to any modulation scheme where the modulation itself is normally not present at the output of the phase detector when the loop is in lock. The invention can be used to ensure that the modulation quality complies with a given set of requirements whether part of a standard or not.

It is important to point out that the modulation noise estimation mechanism of the present invention is not operative to measure actual modulation quality itself but rather is operative to evaluate modulation noise (or other parasitic elements) for purposes of semiconductor fabrication testing. This is accomplished by observing the error signal inside the phase locked loop at the output of the phase comparator or phase detector.

Further, to aid in understanding the principles of the present invention, the description is provided in the context of a digital PLL wherein the signals in the PLL are represented by digital numbers. It is appreciated that the invention is not limited to use with digital PLLs but is also applicable to analog based PLLs as well without departing from the spirit and scope of the present invention.

Figure 2:
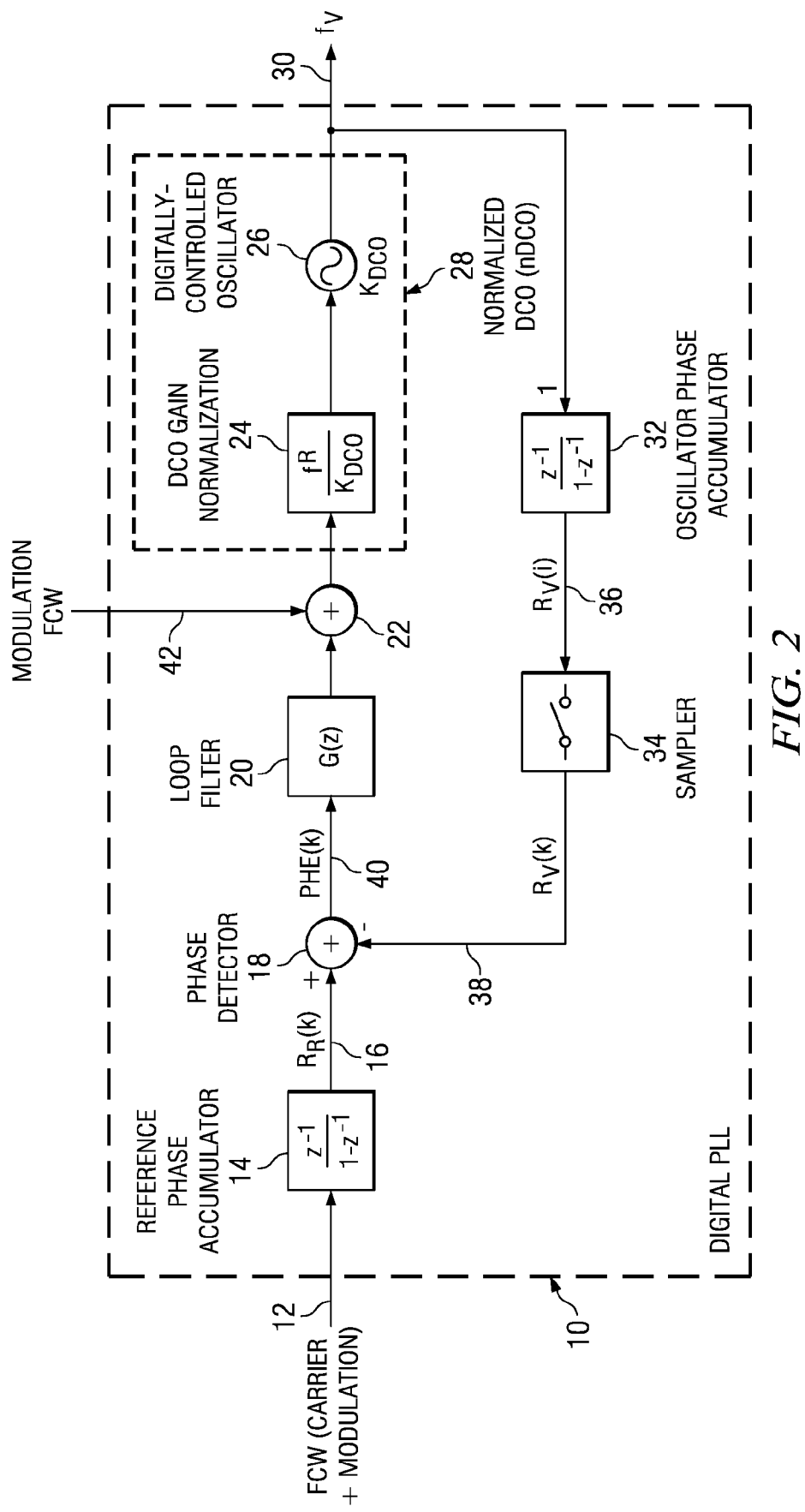
FIG. 2 is a block diagram illustrating a representative digital phase lock loop (PLL) block used to generate the modulated output signal in a transmitter.

A block diagram illustrating a representative digital phase lock loop (PLL) block used to generate the modulated output signal in a transmitter is shown in FIG. 2. The digital PLL, generally referenced 10, comprises a reference phase accumulator 14, phase detector 18, loop filter 20, adder 22, normalized digitally controlled oscillator (nDCO) 28, oscillator phase accumulator 32 and sampler 34.

The frequency command word (FCW) comprising the combination of the carrier and the modulation is applied as the reference to the reference phase accumulator. The output $R_R(k)$ 16 of the reference phase accumulator is input to the phase detector 18. The second input 38 to the phase detector is derived from the output 30 of the PLL generated by the digitally controlled oscillator (DCO) 26. The output of the phase detector is the phase error 40 denoted by PHE(k) or $\phi_E(k)$. The phase error is filtered by the loop filter 20 having a transfer function G(z). The modulation frequency command word is added to the output of the loop filter and functions as the control input to the nDCO 28 which comprises a DCO gain normalization block 24 and DCO 26 with gain $K_{DCO}$.

The PLL 10 employs 2-point modulation whereby the modulation is input at both the reference input and before the nDCO. The injection of the baseband signal in two places in the loop causes the modulation to cancel at the output of the phase detector when the loop is in lock. Although the modulation is not observable at the phase detector output, additive phase noise is present since it is not anticipated and therefore not canceled by the reference. Thus, the contribution of parasitics to the DCO's phase will be seen at the output of the phase detector. In addition to possible modulation inaccuracies and distortion, sources of phase noise include shot noise, thermal noise, 1/f noise, etc. In addition, the quality factor Q of the oscillator, the ambient temperature, the oscillator's DC bias and DC noise and other factors may also affect the phase noise that would be reflected in the phase error signal.

A key principle of the present invention is that the phase error (i.e. the output of the phase detector) corresponds to the undesirable portion of the modulation (i.e. the noise). Due to analysis of the RF modulated signal being considerably more difficult, the present invention estimates the modulation noise by analyzing the phase error signal PHE which is available in the PLL. In the example embodiment presented herein, the phase error is represented by a 25-bit word which changes at a rate of $F_{ref}$=16 MHz, which is the reference frequency of the digital PLL (DPLL).

One consequence of the two-point modulation architecture of the DPLL is that the data modulation injected into the loop is not reflected at the output of the phase detector. Therefore, values of the phase error signal PHE other than its mean correspond to the undesirable portion of the modulation constituting the modulation noise. The modulation noise comprises the combined effect of the noise originating from the reference source $F_{ref}$, the quantization noise associated with the time/phase resolution of digital elements within the DPLL (e.g., inverter delay) and a portion of the noise originating from the RF oscillator (natural noise and induced noise) that is observable within the bandwidth of the PLL. Since the parasitic instantaneous deviation at the RF output corresponds to the instantaneous values of the phase error PHE, the statistics of the deviation errors in the RF output can be estimated through measurements of the phase error signal PHE. Thus, the invention compares the value of the phase error to a predetermined threshold over many samples to determine the probability of error samples that result in incompliance of the transmitter with its target specification. The number of times the phase error exceeds the threshold is counted by an exception counter and after comparing over a plurality of samples, the number of threshold crossings read from the exception counter is used to make a determination whether the device under test passes or fails.

Figure 3:
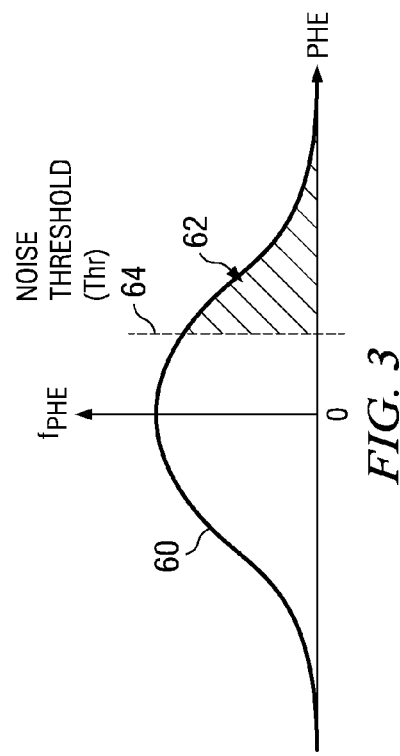
FIG. 3 is a diagram illustrating the statistical distribution of noise samples within the digital PLL in terms of a probability density function.

A diagram illustrating the statistical distribution of noise samples within the digital PLL is shown in FIG. 3. The probability density function, referenced 60, represents the typical statistical distribution of noise in the loop which can be expressed mathematically as $$f_x(x) = k \cdot e^{-\frac{x^2}{2\sigma^2}} \quad (1)$$

where k is a normalization constant, x represents the values of noise samples, and $\sigma$ is the noise variance. It should be noted, however, that the invention does not rely on the noise distribution necessarily being Gaussian. The MNEM could be calibrated to provide a reliable pass/fail indication for any other reasonable distribution as well, since it does not rely on the above mathematical expression.

The total amount of samples exceeding a threshold corresponds to the probability P and is given by $$P = \int_{Thr}^{\infty} f_x(x) dx \quad (2)$$

where x=PHE. This relationship between the probability P and the probability density function $f_x(x)$ is always valid regardless of the form of $f_x(x)$. It is for this reason that the mechanism is universal and would not be limited to a specific probability distribution function. For a given noise threshold Thr (indicated by vertical dotted line 64) the crosshatched area 62 under the curve represents the probability that PHE will exceed the noise threshold Thr. Note that if the PLL is implemented digitally, the quantity PHE is a digital entity. Thus, in accordance with the present invention, the noise power is determined utilizing a digital comparator and a counter, described in more detail hereinbelow. Further, for the same level of noise, the final value of the counter is highly dependent on the threshold chosen. This is illustrated in FIG. 4 which shows the effects of setting the configuration of the noise threshold to difference levels.

Figure 4:
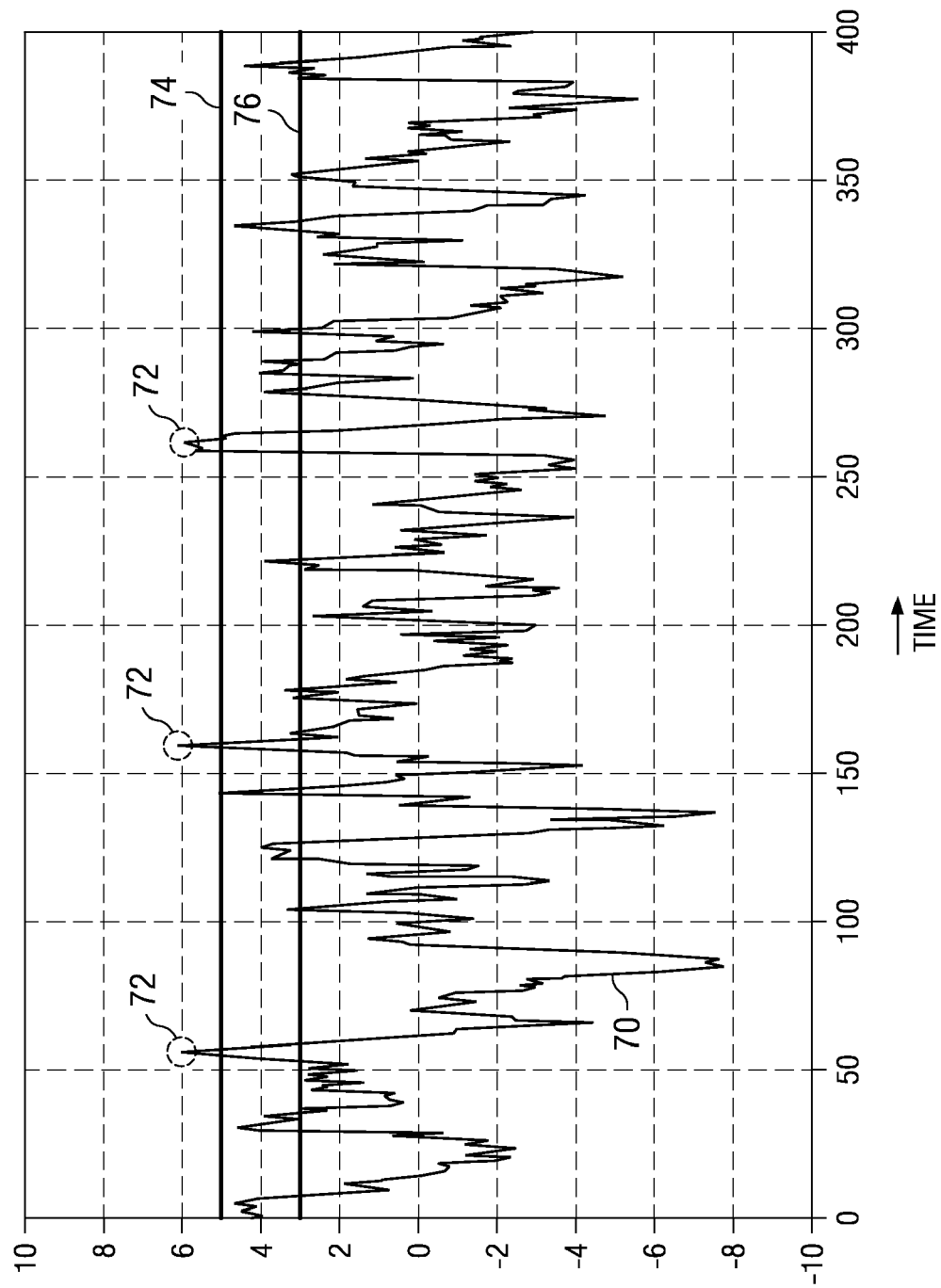
FIG. 4 is a diagram illustrating the effect of setting the configuration of the noise threshold.

With reference to FIG. 4, the waveform 70 represents an example phase error signal PHE versus time. Setting the threshold to a higher level (indicated by solid line 74), yields fewer exception events 72, an exception event being when PHE exceeds the threshold configured. Conversely, setting the threshold to a lower level (indicated by solid line 76), yields more exception events, corresponding to the samples in 72 as well as those between lines 74 and 76. Thus, for the same phase noise present in PHE, the number of exceptions generated over a plurality of symbols can be adjusted in accordance with desired criteria or constraints. For example, in order to provide statistically significant results, it is preferable to have at the end of a test approximately 100 exception events. Thus, depending on the phase noise requirements, the value of the threshold configured can be manipulated along with the number of samples tested, to yield on average 100 exception events when the modulation quality criteria is marginally satisfied.

Figure 5:
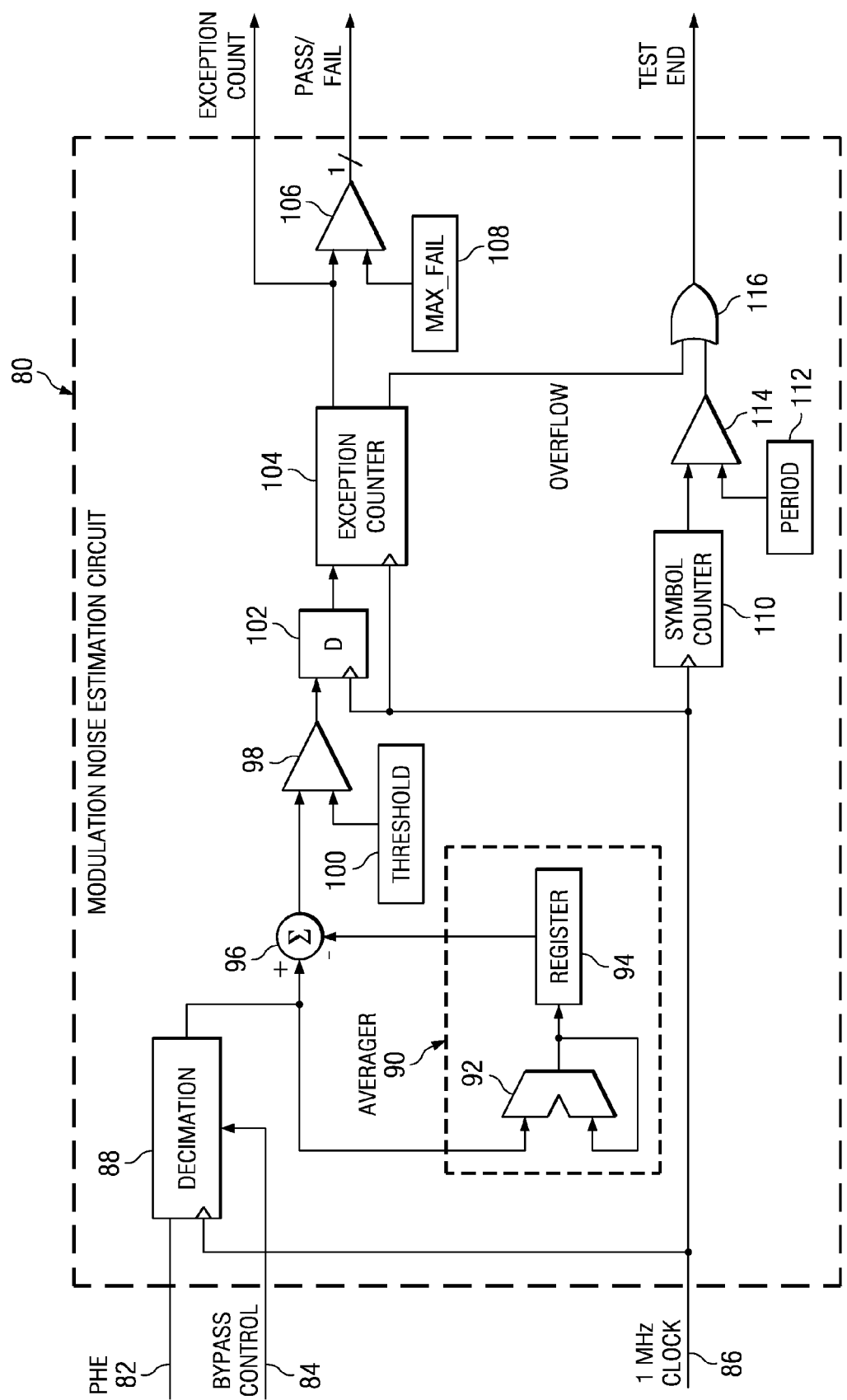
FIG. 5 is a block diagram illustrating an example embodiment of the modulation noise estimation circuit constructed in accordance with the present invention.

A block diagram illustrating an example embodiment of the modulation noise estimation mechanism constructed in accordance with the present invention is shown in FIG. 5. The modulation noise estimation circuit (MNEC), generally referenced 80, comprises an optional decimator 88, averager 90, summer 96, comparators 98, 106, 114, register 102, exception counter 104, symbol counter 110, OR gate 116 and storage registers for error threshold 100, measurement period 112 and maximum failures allowed 108.

The MNEC can operate in one of two modes: decimation and non-decimation mode. The input bypass control 84 controls whether the decimator is active or not. The example MNEC presented herein is adapted to operate with $F_{ref}$ set to 16 MHz. This is the input sample rate for the phase error PHE signal. The symbol rate of 1 MHz is derived directly from $F_{ref}$. In decimation mode, every $16^{th}$ value of PHE is sampled (i.e. a sampling rate of 1 MHz). In non-decimation mode, every PHE value is sampled (i.e. a sampling rate of 16 MHz).

The output of the decimator is input to averager 90 which comprises full adder 92 and register 94. Accumulator/averager 90 comprises circuitry for accumulating a number of consecutive PHE input samples and calculating a moving average therefrom. Note that since the PHE signal may be characterized by an average significantly greater than its variance (only variations around that average are of interest), it is preferable to remove the 'DC' component in order to only have to handle smaller numbers in the subsequent analysis of PHE. In addition, since only deviations from an instantaneous carrier frequency are of interest (the carrier frequency may be allowed some droop, such as in accordance with Bluetooth specifications), the averaging serves to determine the instantaneous carrier frequency against which a sample is compared in order to determine the instantaneous frequency deviation reflected by it. This is achieved by averaging over a plurality of input samples of PHE and subtracting this average value from the PHE signal that is input to the next stage of the circuit. In the example present herein, the input PHE samples are averaged over 8 input samples wherein each sample corresponds to a transmitted symbol of 1 μsec, in accordance with the modulation test defined in the Bluetooth qualification testing specifications, when in decimation mode and over 128 input samples when in non-decimation mode.

The average is output of the averager circuit 90 and subtracted from the next input sample via summer 96. The difference is denoted the zero-mean, DC free, normalized phase error or normalized PHE. The normalized PHE is sampled at a rate of 1 MHz (i.e. one sample per data symbol) and is the entity upon which the modulation noise estimation is based. Preferably, the samples are synchronized with the centers of the data symbols where the frequency deviation is maximal as is typically done in the qualification test equipment.

The normalized phase error result generated every 8 μsec is compared against a configurable 8-bit threshold value denoted threshold stored in register 100. If the threshold is exceeded, a 1 MHz clock pulse is enabled in the 8-bit exception counter 104. Such an event is denoted an exception event. The output of comparator 98 is clocked into D flip flop 102, the output of which is input to the enable input of the exception counter 104. The exception events are counted over a configurable period of time as determined by an 8-bit variable denoted period which is stored in register 112. The period corresponds to the number of symbols to be considered in the test. The 1 MHz clock signal 86 is input to the 17-bit symbol counter 110. The most significant 8-bits of the symbol counter are compared to the period 112 via comparator 114. When the symbol count exceeds the period value, the TEST END signal is asserted via OR gate 116. The TEST END signal is also asserted if an overflow occurs in the exception counter.

The output of the exception counter is compared with a MAX_FAIL value 108 which defines the number of exception events permitted before a compliance test failure is indicated. The output of the exception counter and the MAX_FAIL value are input to comparator 106. The output of the comparator forms the 1-bit PASS/FAIL output signal to be read by the tester. Optionally, the output of the exception counter is also made available at the output of the circuit 80 for debug, external test, internal test based on an integrated processor, or for any other purpose.

Note that there is a tradeoff in configuring the values of the threshold, max_fail and period registers. The tradeoff is between the resulting test time and the statistical accuracy desired. The higher the threshold, the lower the number of exception events. Conversely, the lower the threshold, the higher the number exception events. Preferably, at least 100 exception events should be counted to yield statistically significant results. If there are specific criteria against which the device under test is to be tested, however, it does not necessarily imply that the very same criteria must be implemented in the configuration of the threshold and the other variables.

For example, consider criteria of 0.1% (i.e. $^1/_{1000}$ samples permitted below the minimum frequency deviation). To obtain 100 exception events, the period must be set to approximately 130,000 samples. For the case of 0.0001% (i.e. $^1/_{1,000,000}$) the period would need to be configured for 100,000,000 observations. Since this is impractical, rather than set the period to such a high number, the threshold is lowered to permit many more exception events to occur (e.g., at probability of 0.1%) and thus the same determination as for 0.0001% may be made by extrapolation.

Figures 6, 7:
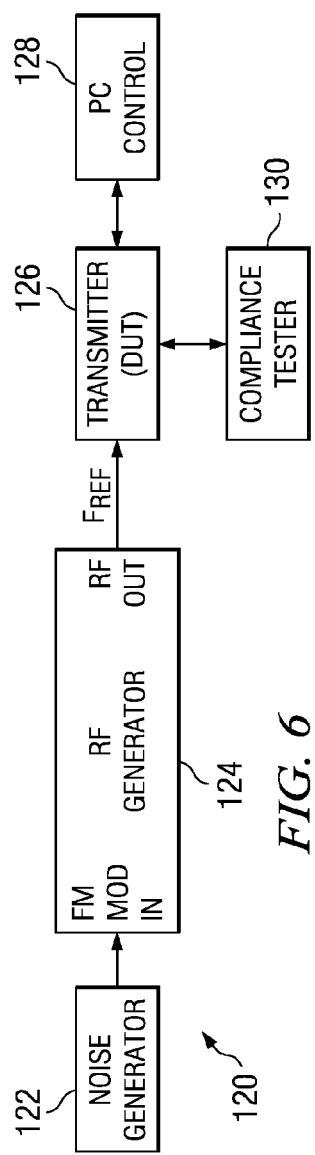
FIG. 6 is a block diagram illustrating the calibration setup used in the characterization of the modulation noise estimation circuit.
FIG. 7 is a table showing the measurement results of calibration performed in accordance with the setup of FIG. 6.

A block diagram illustrating the calibration setup used in the characterization of the MNEC, and in particular for the purpose of determining the thresholds and extrapolation relationships is shown in FIG. 6. The calibration setup, generally referenced 120, comprises a noise generator 122, RF generator with modulation capability 124, the transmitter to be tested 126, computer, PC or other control device 128 and a compliance tester 130 which performs its analysis on the transmitter's modulated output signal.

The function of the noise generator is to emulate the phase noise at baseband frequencies. The noise generated is input to the RF generator which functions to generate the reference frequency $F_{REF}$ in the 16 MHz frequency range. The frequency modulation signal output of the RF generator incorporates the reference frequency needed by the transmitter (16 MHz in the example embodiment) and the modulation noise caused by the noise generator. This low reference frequency is input to the transmitter, i.e. the device under test (DUT), which is designed to derive its output frequency from a low reference frequency such as a crystal, where the effect of modulation noise on it would be amplified in accordance with the ratio between the RF frequency generated by the transmitter (i.e. the carrier frequency) and the lower reference frequency.

A PC or other control device is used to configure and control the MNEM within the transmitter under test. The compliance tester functions to perform the qualification tests in accordance with the particular standard or target specifications. In the case of Bluetooth, in the characterization process, a tester such as the Digital Radio Communication Tester CMU200 (manufactured by Rohde & Schwarz GmbH & Co., Munich, Germany), may be used to receive the Bluetooth packets at 2.4 GHz, analyze them and provide modulation test results and a pass/fail indication in accordance with the limits defined in the Bluetooth specifications. Note that other testers, more or less sophisticated that the CMU200 tester are also contemplated for use with the invention.

As described hereinabove, the parameters of the MNEM including threshold, period and max_fail must be configured in accordance with the particular performance criteria. These parameters, in particular the threshold value, may be determined empirically by measurement, as well as through analysis and simulations. In order to characterize the modulation noise estimation circuitry, a series of tests was performed, the results of which are presented in a table showing the measurement results of calibration performed in accordance with the test calibration setup of FIG. 6.

For each test, the noise generator 122 (FIG. 6) was configured to output different levels amounts of noise, which translate into corresponding levels of phase noise by means of the RF generator operating as a frequency modulator. In addition, the frequency modulation factor applied to the 16 MHz carrier $F_{REF}$ could be varied as well to obtain the same effect (i.e. setting the relative level of phase noise on the reference signal). The amount of frequency deviation applied varied from 28 to 7.2 kHz for a fixed level of noise at the output of the noise generator, such that a set of corresponding phase noise levels was observed at the RF output of the transmitter, as listed in the leftmost column of the table of FIG. 7. Each level of resultant (i.e. artificial) phase noise corresponds to a particular probability of failure which is shown in the third column in the table of FIG. 7. As described above, a compliance failure according to the Bluetooth specifications occurs when the frequency deviation in the modulated transmit output signal falls under 115 kHz more than 0.1% of the time for a '1010' sequence, for which the nominal peak deviation is approximately 141 kHz. The contents of the exception counter at the conclusion of the test is shown in hex format in the fourth column. An overflow indicates a value of over 0xFF. Also indicated is the results of tests performed by test equipment adapted to qualify devices compliance with a standard. In this example such a device may comprise a CMU200 tester adapted to qualify device's compliance with the Bluetooth standard. The results of the compliance test indicate either a pass or fail.

Note that the device just passes the test with 99.95 probability of having frequency deviation greater than 115 kHz with a frequency deviation of 13.6 kHz and phase noise of −48.5 dBc. The contents of the exception counter at the conclusion of this test was 0xB7. Thus, for this example setting the threshold register sufficiently close to 0xB7 will enable the screening of parts embodying the MNEM for compliance with the modulation noise requirements of the Bluetooth standard.

In general terms, the optimal MNEM parameters to be used may be determined empirically for any desired standard using the following procedure and assuming a calibration setup similar to that of FIG. 6. First, the phase noise produced by the noise generator frequency-modulating the RF generator from which the reference frequency is output is adjusted so that tests performed by the compliance tester just marginally begin to fail. It is now known that the amount of phase noise generated by the noise generator is the amount permitted before the device under test begins failing the compliance test. Second, it is preferable to trip the test (i.e. indicate failure) at approximately 100 exception events in order to achieve statistically significant results. Thus, the max_fail variable is set to 100. Third, the threshold and period are then adjusted so as to marginally indicate a failure.

It is noted that although the modulation noise estimation mechanism of the present invention was described in the context of a digital phase locked loop, it can be implemented in an analog environment as well. In the latter case, the phase error is an analog voltage rather than a digital number and an analog comparator can be used to compare the analog phase error with an analog voltage representing the threshold. Note that digital to analog converters may be used to adapt the mechanism described herein for use with an analog based phase locked loop.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of testing an oscillator within a phase locked loop, said method comprising the steps of:
   averaging phase error samples produced by said phase locked loop, wherein said phase error samples correspond to the phase noise of said oscillator;
   subtracting said average from a current phase error sample to yield a normalized phase error;
   generating an exception event if said normalized phase error exceeds a threshold, thereby indicating that the level of oscillator phase noise is not acceptable; and
   repeating said steps of averaging, subtracting and generating over a period of time and outputting a test failure indication if the number of exception events exceeds a maximum criterion and a test pass indication otherwise.

2. The method according to claim 1, wherein said step of averaging comprises the step of calculating a moving average over a plurality of phase error samples.

3. The method according to claim 1, wherein said threshold is configurable.

4. The method according to claim 1, wherein said maximum failure criterion is configurable.

5. The method according to claim 1, wherein said period of time is configurable and corresponds to the number of symbols to be considered in estimating said phase noise.

6. The method according to claim 1, further comprising the step of decimating said phase error samples before said step of averaging.

7. The method according to claim 1, implemented in testing software residing in an integrated on-chip processor thereby eliminating the need for external software and hardware to implement said method.

8. The method according to claim 1, wherein said phase error samples comprise filtered phase error samples.

9. The method according to claim 1, wherein said phase locked loop is used as the local oscillator for a transceiver compliant with a Bluetooth standard.

10. The method according to claim 1, wherein said phase locked loop is used in a transceiver within a wireless communications network.

11. The method according to claim 1, wherein the phase locked loop comprises a digital phase locked loop.

12. The method according to claim 1, implemented in an Application Specific Integrated Circuit (ASIC).

13. The method according to claim 1, implemented in a Field Programmable Gate Array (FPGA).

14. An apparatus for testing an oscillator in a phase locked loop having a phase locked loop, comprising:
   means for averaging phase error samples produced by said phase locked loop;
   means for subtracting said average from a current phase error sample to yield a normalized phase error, wherein said normalized phase error corresponds to the phase modulation noise of said oscillator;
   means for generating an exception event if said normalized phase error exceeds a threshold; and
   means for repeating said functions of averaging, subtracting and generating over a period of time and outputting a test failure indication if the number of exception events exceeds a maximum criterion and a test pass indication otherwise.

15. The apparatus according to claim 14, wherein said means for averaging comprises means for calculating a moving average over a plurality of phase error samples.

16. The apparatus according to claim 14, wherein said threshold is configurable.

17. The apparatus according to claim 14, wherein said maximum failure criterion is configurable.

18. The apparatus according to claim 14, wherein said period of time is configurable.

19. The apparatus according to claim 14, further comprising means for decimating said phase error samples before said average is calculated.

20. The apparatus according to claim 14, implemented in testing software adapted to execute on an on-chip software based processor.

21. The apparatus according to claim 20, wherein said testing software is stored in rewritable memory wherein said testing software is replaced by normal operation software once testing is complete.

22. The apparatus according to claim 14, implemented in an Application Specific Integrated Circuit (ASIC).

23. The apparatus according to claim 14, implemented in a Field Programmable Gate Array (FPGA).

24. An apparatus for testing an oscillator in a phase locked loop, comprising:
   first means for measuring a phase error signal within said phase locked loop, wherein said phase error signal corresponds to the phase noise of said oscillator;
   second means for comparing a plurality of phase error signal samples over a period of time to a threshold and generating an exception event each time a phase error signal sample exceeds said threshold; and
   generating a test failure indication if the number of exception events exceeds a defined limit and generating a test pass indication otherwise.

25. The apparatus according to claim 24, wherein said phase error signal comprises a digital sample.

26. The apparatus according to claim 24, wherein said phase error signal comprises an analog sample.

27. The apparatus according to claim 24, wherein said threshold is configurable.

28. The apparatus according to claim 24, wherein said criteria is configurable.

29. The apparatus according to claim 24, wherein said period of time is configurable.

30. The apparatus according to claim 24, wherein said threshold is configured to correspond to a particular noise threshold on a modulation noise probability density function.

31. The apparatus according to claim 24, wherein lowering said threshold causes the number of exception events to increase for the same criteria and period of time and increasing said threshold causes the number of exception events to decrease for the same criteria and period of time.

32. The method according to claim 24, implemented in testing software adapted to execute on an embedded microprocessor or digital signal processor.

33. The apparatus according to claim 32, wherein said testing software is stored in rewritable memory wherein said testing software is replaced by normal operation software once testing is complete.

34. The apparatus according to claim 24, implemented in an Application Specific Integrated Circuit (ASIC).

35. The apparatus according to claim 24, implemented in a Field Programmable Gate Array (FPGA).

36. A method of testing an oscillator in a phase locked loop, said method comprising the steps of:
   generating a normalized phase error signal from a plurality of phase error samples generated by said phase locked loop; and
   counting the number of times said normalized phase error signal crosses a threshold within a predefined period of time, wherein the count represents an estimate of the phase modulation noise of said oscillator; and
   failing said oscillator if said count exceeds a predefined maximum, and passing said oscillator otherwise.

37. The method according to claim 36, wherein said maximum corresponds to a modulation quality requirement of a particular standard.

* * * * *